United States Patent [19]

Gray et al.

[11] Patent Number: 5,309,323

[45] Date of Patent: May 3, 1994

[54] REMOVABLE ELECTRICAL UNIT WITH COMBINED GRIP AND RELEASE MECHANISM EXPOSED BY PARTIAL WITHDRAWAL

[75] Inventors: David J. Gray, Nr Fareham; Ian Golledge, Romsey; Steven R. Spake, Southampton, all of United Kingdom

[73] Assignee: International Business Machines Corporation, Armonk, N.Y.

[21] Appl. No.: 965,372

[22] PCT Filed: Apr. 26, 1991

[86] PCT No.: PCT/GB91/00699

§ 371 Date: Feb. 12, 1993

§ 102(e) Date: Feb. 12, 1993

[87] PCT Pub. No.: WO92/20206

PCT Pub. Date: Nov. 12, 1992

[51] Int. Cl.⁵ .......................... H05K 7/10; H05K 7/14
[52] U.S. Cl. ..................................... 361/726; 361/685; 312/332.1; 312/334.44
[58] Field of Search ............. 312/330.1, 332.1, 334.44, 312/334.46, 348.6; 211/40, 83; 361/339, 343, 391, 392, 394, 415, 609, 615, 725-732, 796, 798, 801, 683-685

[56] References Cited

U.S. PATENT DOCUMENTS 3,521,939 7/1970 Fall et al. ................... 312/334.44 X
4,006,951 2/1977 Geer et al. .................... 312/332.1
4,818,986 4/1989 Bauman ........................ 361/391 X

FOREIGN PATENT DOCUMENTS 1282756 11/1968 Fed. Rep. of Germany .
2002350 7/1971 Fed. Rep. of Germany ......... H05K 7/14
3013517 10/1981 Fed. Rep. of Germany ......... H05K 7/14

OTHER PUBLICATIONS

IBM Technical Disclosure Bulletin, vol. 33, No. 6B, Nov. 1990, pp. 76-77, "Removable and Transportation DASD".

Primary Examiner—Leo P. Picard
Assistant Examiner—Michael W. Phillips
Attorney, Agent, or Firm—Roy W. Truelson

[57] ABSTRACT

A removable electrical unit 20 is described which incorporates a soft stop and releasing mechanism which is employed to prevent removal of the unit from its housing in an unsafe manner. In operation, the unit is pulled from the housing by means of a front handle 22 on the unit and when the unit is partially removed from its housing a stop block 72 on the unit engages a stop spring 90 on the housing. A second handle 30 on the top of the unit becomes accessible and is actuated to disengage the stop block and stop spring. The unit may then be completely removed from the housing in a safe two handed manner.

13 Claims, 7 Drawing Sheets

DIRECTION OF REMOVAL

REMOVABLE ELECTRICAL UNIT WITH COMBINED GRIP AND RELEASE MECHANISM EXPOSED BY PARTIAL WITHDRAWAL

TECHNICAL FIELD OF THE INVENTION

This invention relates to the field of electrical units which are removable from their housing.

BACKGROUND OF THE INVENTION

A current trend in the design of electrical systems is the provision of modular configurations whereby the individual electrical devices making up the system are removable from the system housing. Such systems provide a number of advantages. The customer is able to buy a system which has a combination of different device types tailored to his own requirements. In addition, the manufacturer is able to offer a large number of different systems based on a smaller range of individual device types. If a device becomes defective, it can be removed for repair and replaced with a good device without seriously degrading the performance of the system as a whole.

One type of multi component system is a mass data storage subsystem which comprises removable data storage devices, e.g. disk drives, mounted in a chassis which also contains associated device controllers, power supplies and cooling fans.

With removable disk drives, extra provision in the form of improved shock mounts is commonly required to provide protection for the head disk assembly during handling. Although it may be possible to provide protection sufficient to cope with most handling conditions, it is extremely difficult to achieve such a level of protection within the limited space of a fixed form factor e.g. 5.25 inches. Care is also needed when inserting or removing the disk drive into or from the chassis in order to avoid damage to the head disk assembly.

An article entitled 'Removable and Transportable DASD' (IBM Technical Disclosure Bulletin vol. 33 No. 6B November 1990 pp 76-77) describes a disk file module which is designed to be removably installed in the chassis of a user system. The module includes a first handle on its front surface for use in removing the module from either rack or tower mounting chassis. A second handle which folds flat at the top of the unit may be used an additional carrying aid.

A similar arrangement is employed in the EMR removable disk subsystem manufactured by Emulex Corporation. A pair of removable Portable Disk Modules (PDM) are mounted in a chassis and each module has a front mounted handle and a second handle hingeably attached to its top surface. The second handle is presumably used to assist in removal of the module from the chassis.

DISCLOSURE OF THE INVENTION

Accordingly, the invention provides a removable electrical unit for location in the chassis of an electrical apparatus, the unit including catch means mounted on an outer surface thereof and adapted to engage with stop means mounted on an inner surface of the chassis when the unit is partly withdrawn from the chassis, thereby to prevent complete removal therefrom, the unit further including a combined grip and release mechanism in the form of a handle, exposed by said partial withdrawal, which is operable to disengage the catch means from the stop means thereby to allow complete withdrawal of the unit from the chassis.

When the electrical unit is partially withdrawn from the chassis the catch means and stop means engage thereby preventing complete removal. The combined grip and release mechanism on the unit is actuated to disengage the stop and catch means and the unit can then be completely removed from the chassis. In this way, the user is prevented from removing the unit in such a manner that may cause damage to the electrical/electronic components of the unit and is forced to use the handle in order to remove the unit from the chassis.

It is further preferred that when the unit is at the partly removed position, the handle is movable from a first position lying flush with the surface of the unit, where the latch is engaged with the stop, to a second position standing proud from the unit surface, where the latch is disengaged from the stop.

In a preferred arrangement, the stop means is resilient and deforms when engaged by the latch means when the unit reaches the partly removed position during removal of the unit from the chassis. In this way, the compressibility of the stop means provides a soft stop which avoids damage to sensitive components of the electrical unit which may possibly be caused by abrupt contact of the stop means and latch means during removal of the unit.

In a second aspect of the invention, there is provided an electrical apparatus comprising a chassis in which is mounted at least one removable electrical unit as claimed in the appended claims.

A preferred embodiment of the invention will now be described by way of example only with reference to the accompanying drawings.

DETAILED DESCRIPTION OF THE INVENTION

Figure 1:
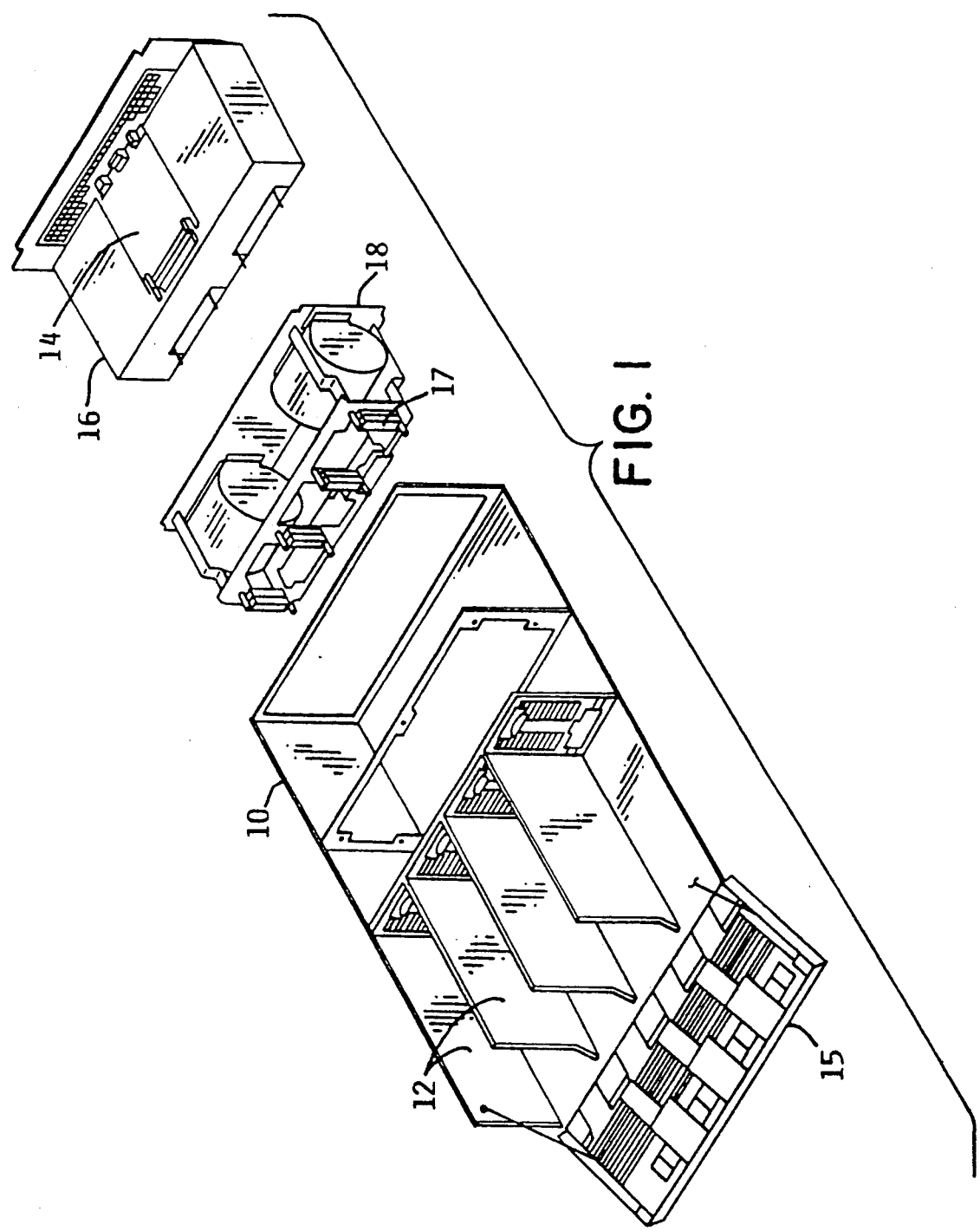
FIG. 1 is an exploded perspective view of a data storage subsystem including removable disk drives.

Referring to FIG. 1, there is shown a data storage subsystem which comprises four removable disk drives 20 (two of which are shown) each of which is mountable into a corresponding device bay 12 in the front of the subsystem chassis 10. Cooling fans 18, a power supply 16 and disk drive controller card 14 are mounted in the chassis behind the disk drives. A device bay is defined by top, bottom and side walls of the chassis. Hingeably attached to the front of the chassis is a front cover 15. When it is desired to obtain access to the front of disk drives in order to remove them from the chassis, the front cover is pulled down to the position shown in FIG. 1.

Each removable disk drive incorporates a soft stop and release mechanism which is employed to prevent removal of the unit from the chassis in an unsafe manner. As will be described in greater detail below, when the disk drive is partially removed from the chassis, a stop block unit 70 (see FIG. 7) projecting from the top surface of the disk drive housing hits a stop spring 84 which is fixed to the inner surface of the chassis. The release mechanism takes the form of a user operated top handle 30 which is connected to the stop block unit via a link plate 50. Actuation of the handle causes disengagement of the stop block and stop spring.

Figure 2:
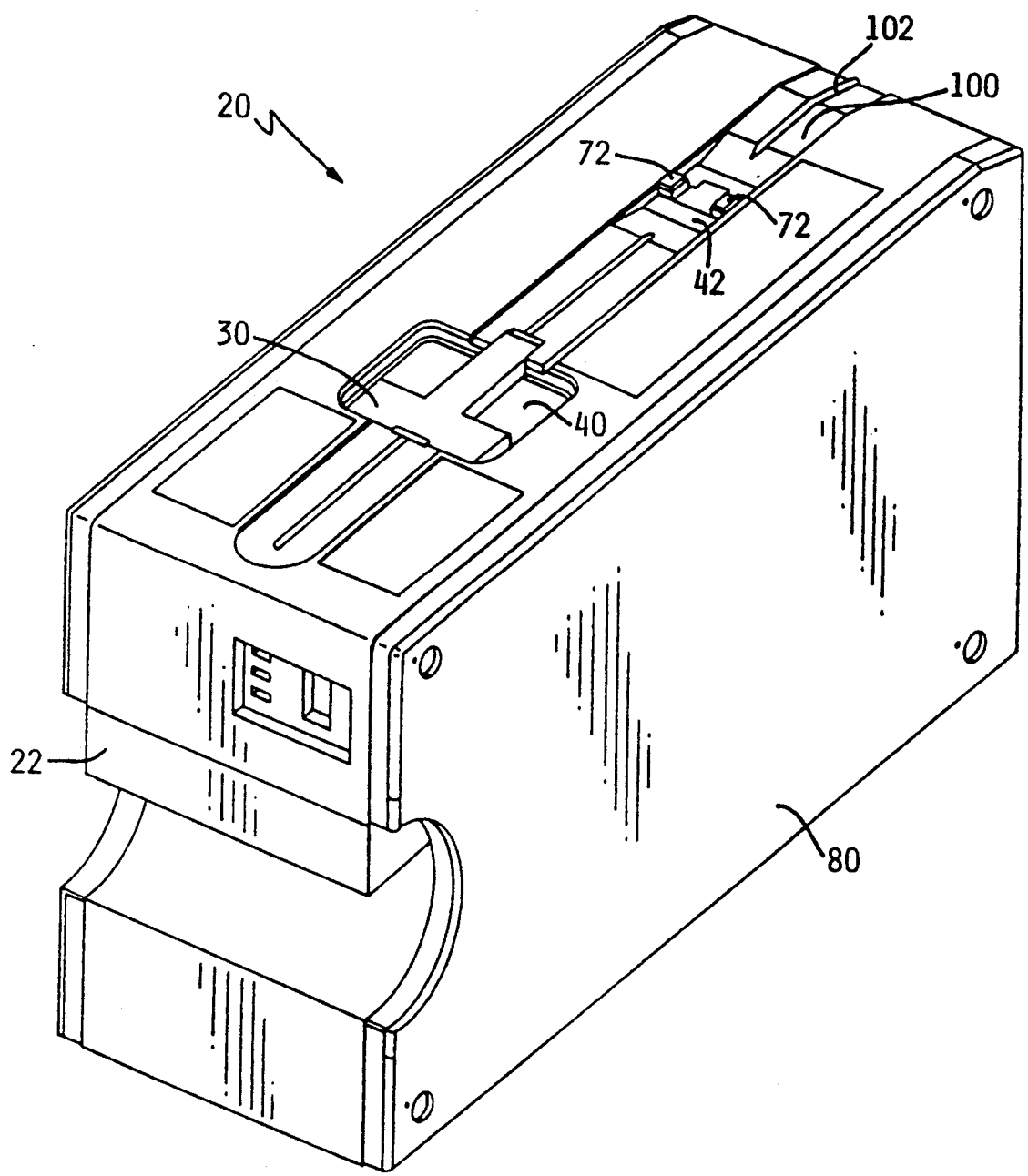
FIG. 2 is a perspective view of one of the removable disk drives of FIG. 1.

FIG. 2 shows the exterior of the disk drive housing 20 in which the head disk assembly and associated electronics are mounted. Extending along the top surface of the housing is a groove 100 which is divided longitudinally into two portions by a central rib 102. The rib provides a sacrificial wear strip to prevent damage to the top surface of the unit during insertion and withdrawal into and out of the chassis. Recesses in the top surface interrupt the groove in two positions. The top handle 30 of the release mechanism is positioned in a first recess 40 nearest the front surface of the housing. Projections 72 on the stop block unit 70 protrude through an aperture in the housing into a second recess 42 nearer the rear of the housing. The housing also includes a front handle 22 on its front surface which is used to pull the device from the system chassis.

Figure 3:
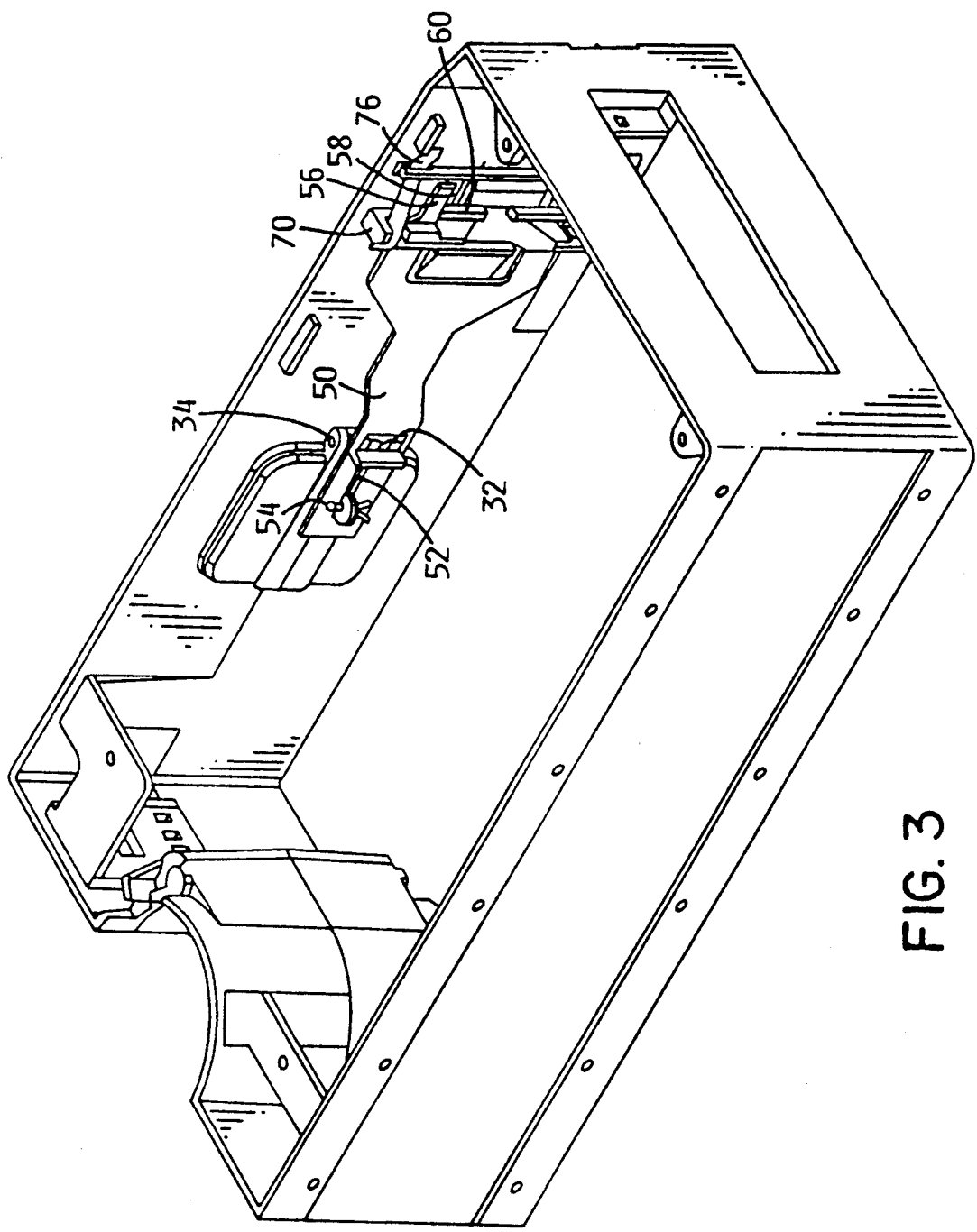
FIG. 3 is a first perspective view of the interior of the housing of a FIG. 2 disk drive showing the release mechanism employed in the present invention.
Figure 4:
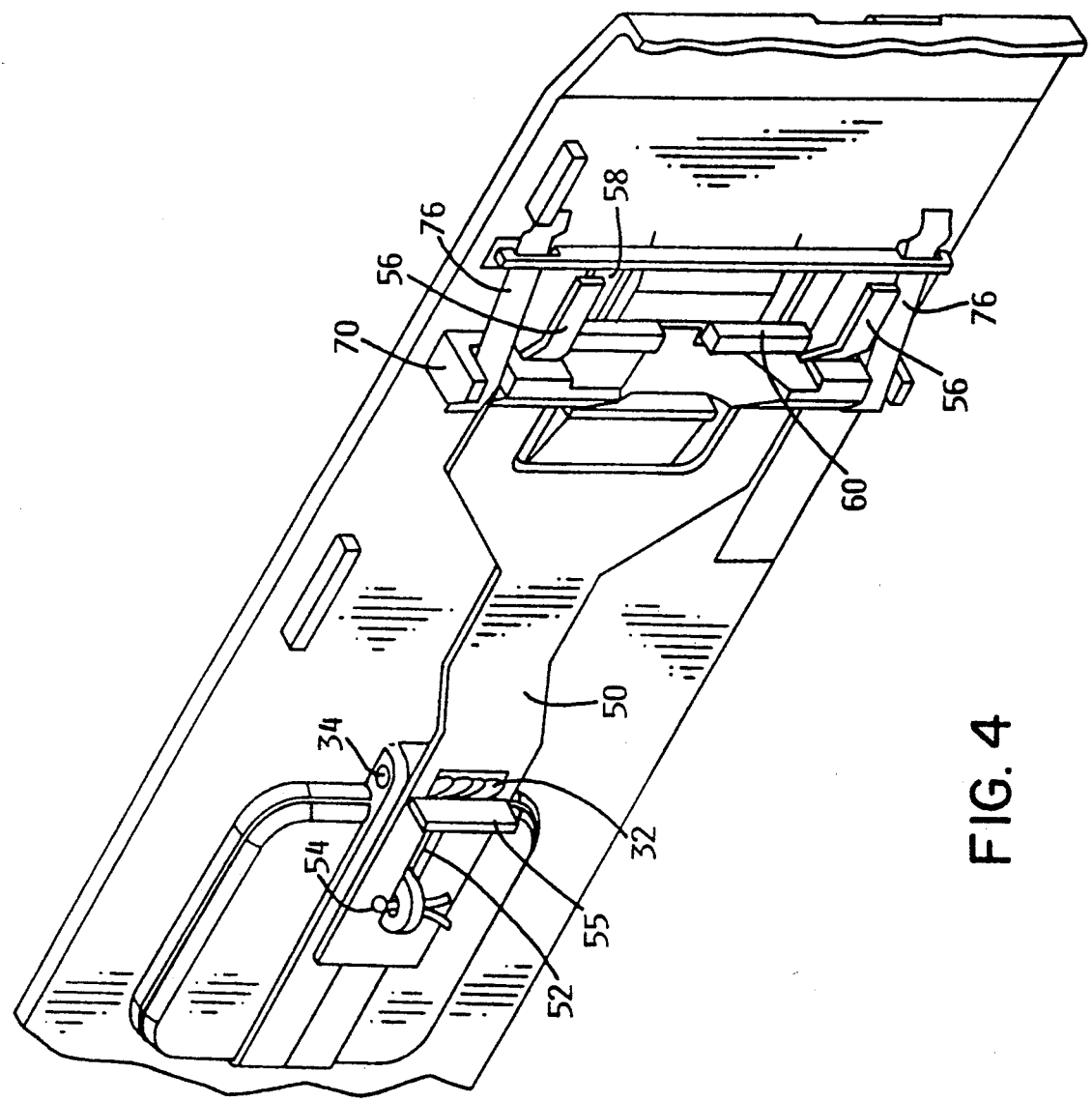
FIG. 4 is a more detailed view of the release mechanism shown in FIG. 3.
Figure 5:
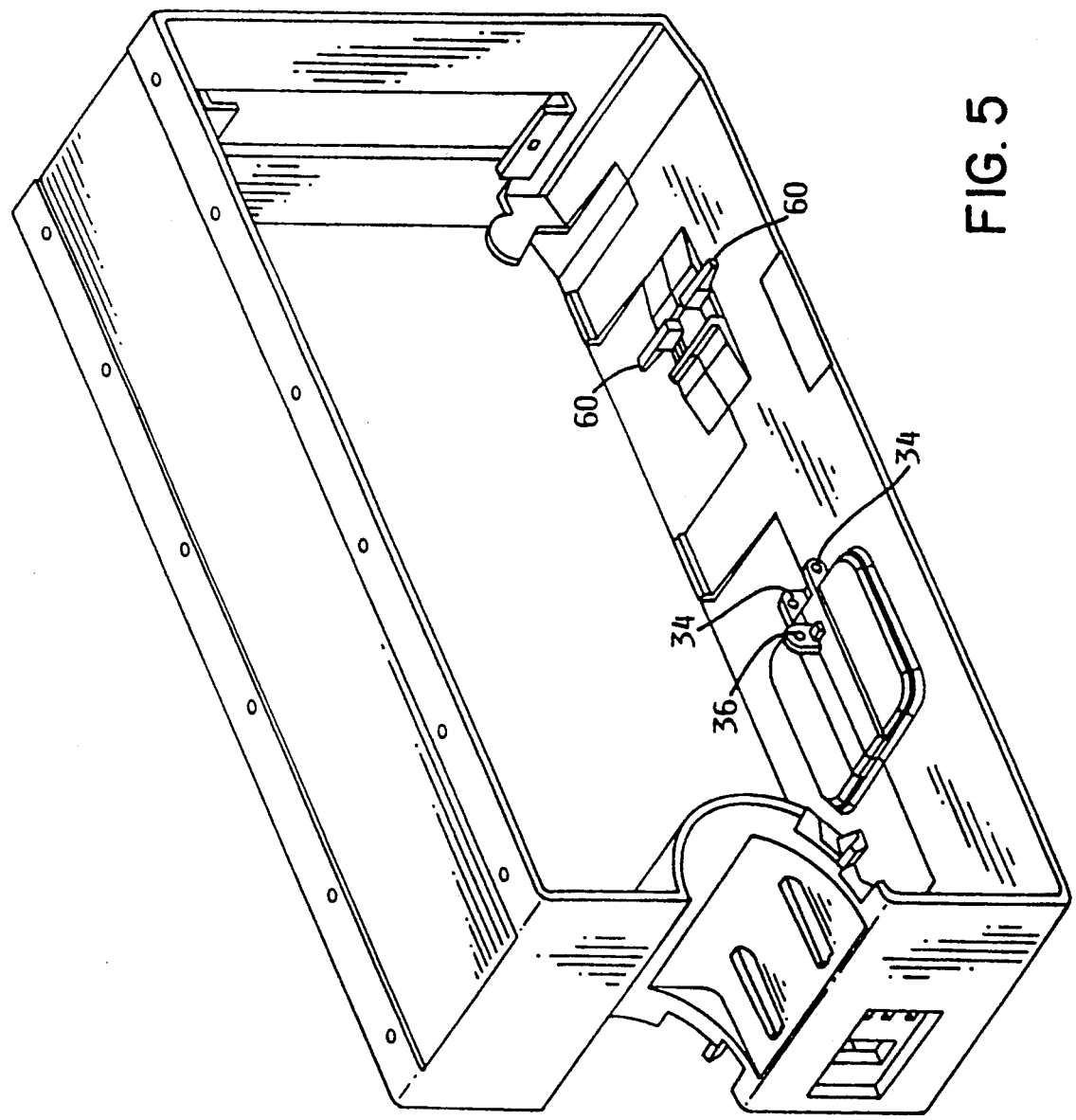
FIG. 5 is a second perspective view of a FIG. 2 device excluding the release mechanism.
Figure 6:
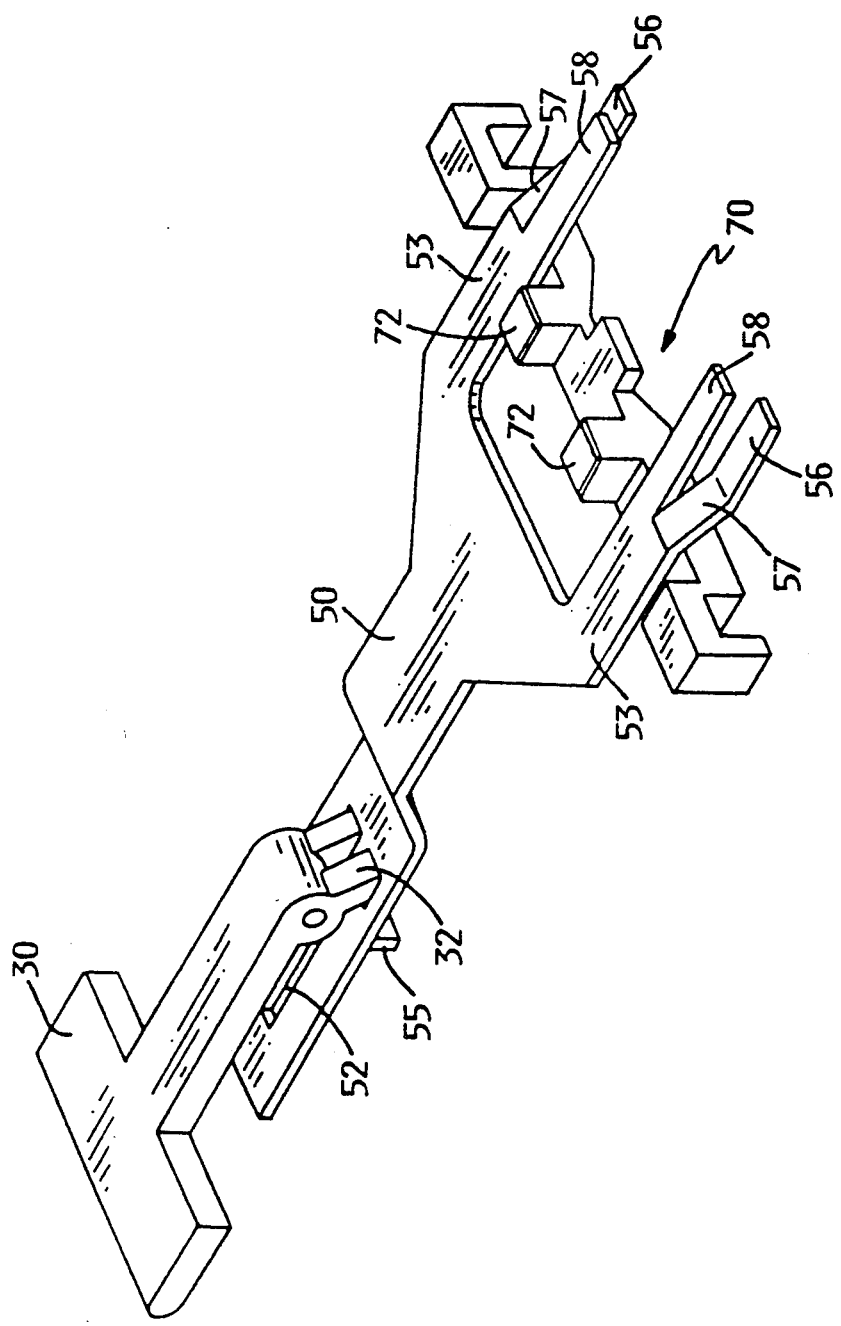
FIG. 6 is a perspective view of the catch release mechanism as employed in the removable disk drive of FIG. 2.

FIG. 3 shows the interior of the disk drive housing with the sidewall 80 (FIG. 2) and the head disk assembly removed in order to show the release mechanism and stop block unit. The top handle shown in FIG. 2 is hingeably attached to the housing by means of a hinge pin which passes through the handle and through a pair of holes 34 defined on the inner surface of the housing (seen best in FIG. 5). The top handle includes two teeth 32 which pass through an opening in the top surface of the housing and engage in corresponding slots in the link plate 50 (FIG. 6). One end of the link plate is held in position adjacent the inner surface of the housing by a split pin 54 which passes through a hole in a pillar 36 (FIG. 5) standing proud of the housing inner surface. The pillar passes through a slot 52 in the link plate. Two prongs 58 at the other end of the link plate locate under a pair of ears 60 which are part of the housing casting. The link plate is free to move along the length of the housing to an extend limited by the length of the link plate slot.

The stop block unit 70 shown in FIG. 6 fits into a recess in the housing adjacent the cast ears. Two upwardly extending projections 72 of the unit protrude through an aperture in the housing. Two retaining springs 76 fixed on the inner surface of the housing bear against the ends of the stop block unit thereby holding it place in the disk drive housing. When the release mechanism is assembled in the disk drive housing, two fingers 56 of the link plate bear against angled faces 74 of the stop block unit.

Figure 7A:
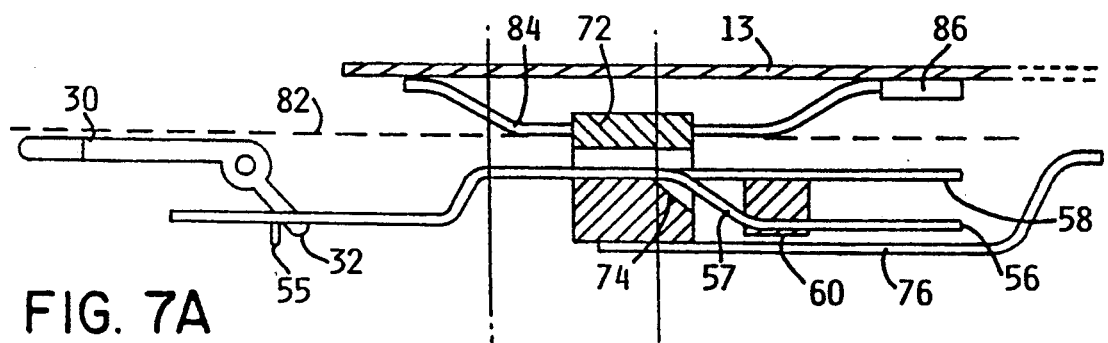
FIG. 7A is a schematic view of the catch and release mechanism, with the stop block engaged with the stop spring.
Figure 7B:
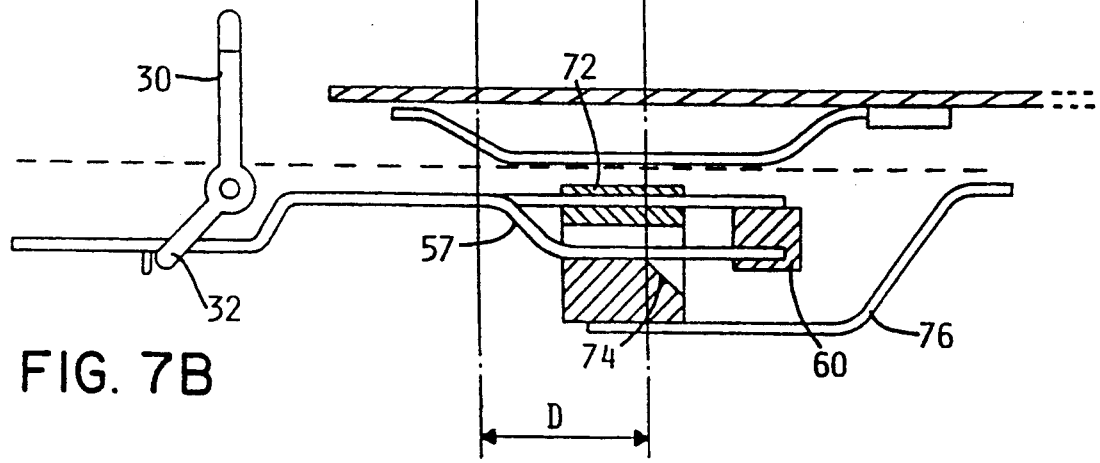
FIG. 7B is a schematic view of the catch and release mechanism, with the stop block disengaged from the stop spring.
Figure 7C:
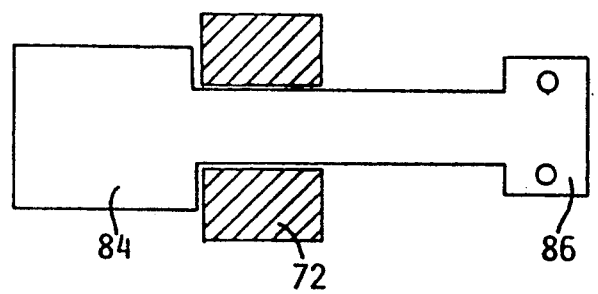
FIG. 7C is a schematic plan view of the stop spring and part of the stop block.

FIG. 7 shows, in schematic form, the removable disk drive in two positions with respect to the chassis. In FIG. 7A, the disk drive is partly removed from the chassis with the top handle in the down position and the stop block against the stop spring. FIG. 7B shows the removable disk drive with the top handle in the up position and the stop block disengaged from the stop spring. The distance moved by the link plate during actuation of the handle is indicated by 'D' in FIG. 7. FIG. 7C is a plan view of the position of the stop spring 84 relative to the stop block projections 72.

In operation, the disk drive is removed from the chassis until the projections 72 engage the stop spring 84 which is fixed at one end 86 to the inner top surface 13 of the chassis (FIG. 7A). The resilience of the stop spring is designed to provide a 'soft stop' so as to avoid damage to the head disk assembly when the projections hit the stop spring. In this position, the front portion of the disk drive (e.g. half of the length of the disk drive) projects beyond the front of the chassis. Dotted line 82 indicates the position of the top surface of the disk drive. In this position, the top handle is accessible to the operator (when the disk drive is fully inserted in the chassis, the top handle is not accessible). To delatch the stop block from the stop spring, the handle is raised to the upright position thereby causing the teeth 32 at the end of the handle to bear against bearing surface 55 thereby moving the link plate into the position shown in FIG. 7B. The link plate moves with respect to the housing and angled faces 57 on the link plate engage angled surfaces 74 of the stop block. Because the prongs 58 of the link plate are held under the cast ears of the housing, the fingers 56 force the stop block down relative to the disk drive housing and against the retaining spring 76. This causes the stop block to clear the stop spring and the disk drive can then be removed from the chassis in a safe two handed manner.

When the removable disk drive is inserted into the chassis, the stop spring mounted in the chassis rides on the central rib on the top surface of the disk drive. The spring passes over the stop block projections 72, forcing the stop block down against the retaining spring. When the stop spring has passed over the stop block projections, the retaining spring pushes the stop block unit in to position with the projections protruding through the aperture in the housing. The spring gives a constant pressure onto the removable device which provides a controlled insertion of the device into the chassis thus protecting the connector at the rear of the device and head disk assembly from shock. Thus, the operator cannot insert the device at a velocity which could cause damage. Furthermore, the stop spring is in constant contact with the disk drive housing during insertion and provides a grounding path from the chassis to the removable disk drive and also provides Radio Frequency Interference (RFI) suppression.

When the drive is fully inserted into its bay, a connector (not shown) at the rear of the disk drive mates with a corresponding connector 17 on the fan assembly 18. Cabling (not shown) connects the disk drive via connector 17 to the controller card and power supply. While not essential for carrying out the present invention, details of the connectors and technique by which the disk drive may be latched and locked in position in the chassis can be found in co-pending international application PCT/GB 91/00253 filed Feb. 19, 1991, which was published Dec. 26, 1991 as international patent publication number WO91/20083. This application is hereby incorporated by reference.

We claim:

1. A removable electrical unit for location in the chassis of an electrical apparatus, the unit comprising:

catch means mounted on an outer surface thereof and adapted to engage with stop means comprising a spring mounted on an inner surface of the chassis when the unit is partly withdrawn from the chassis, thereby to prevent complete removal therefrom, said catch means comprising a stop block protruding from the outer surface of the unit which is fixed at one end to the inner surface of the chassis;

a combined grip and release mechanism in the form of a handle, exposed by said partial withdrawal, which is operable to disengage the catch means from the stop means to allow complete withdrawal of the unit from the chassis, said the handle being connected to the stop block by means of a movable link plate, wherein when the unit is in said partly removed position, movement of the handle from first to second position causes the link plate to bear against the block to cause the block to disengage from the stop means; and a retaining spring fixed to the unit and arranged to engage the lower surface of the stop block wherein when said handle is moved from first to second position, the stop block bears against the retaining spring.

2. A removable electrical unit as claimed in claim 1, wherein when the unit is at said partly withdrawn position, the handle is movable from a first position lying flush with the surface of the unit, where the catch is engaged with the stop, to a second position standing proud from the unit surface, where the catch is disengaged from the stop.

3. A removable unit as claimed in claim 1 further comprising a second handle at the front of the unit for use in withdrawing the unit from the chassis to said partly withdrawn position.

4. An electrical apparatus, comprising:

(a) a chassis having at least one bay for mounting a removable electrical unit, said chassis having stop means mounted on an inner surface of said chassis facing said bay; and (b) at least one removable electrical unit mounted within said bay of said chassis, said removable electrical unit comprising i) catch means mounted on an outer surface thereof and adapted to engage with said stop means of said chassis when the unit is partly withdrawn from the chassis, thereby preventing complete removal therefrom, and ii) a combined grip and release mechanism in the form of a handle, exposed by said partial withdrawal, which is operable to disengage the catch means from the stop means to allow complete withdrawal of the unit from the chassis, wherein when the unit is at said partly withdrawn position, the handle is movable from a first position lying flush with the surface of the unit, where the catch is engaged with the stop, to a second position standing proud from the unit surface, where the catch is disengaged from the stop.

5. The electrical apparatus of claim 4, wherein the stop means is resilient and is deformable when engaged by the catch means when the unit reaches said partly withdrawn position during withdrawal of the unit from the chassis.

6. The electrical apparatus of claim 5, wherein the catch means comprises a stop block protruding from the outer surface of the unit and the stop means comprises a spring which is fixed as one end to the inner surface of the chassis.

7. The electrical apparatus of claim 6, wherein the handle is connected to the stop block by means of a movable link plate, and wherein when the unit is in said partly removed position, movement of the handle from a first to second position causes the link plate to bear against the block to cause the block to disengage from the stop means.

8. The electrical apparatus of claim 7, further comprising a retaining spring fixed to the unit and arranged to engage the lower surface of the stop block wherein when said handle is moved from first to second position, the stop block bears against the retaining spring.

9. The electrical apparatus of claim 4, wherein said handle is mounted on the top surface of said unit, and said handle is designed for gripping and carrying to support the full weight of the unit.

10. A removable electrical unit for location in the chassis of an electrical apparatus, the unit comprising:

catch means mounted on an outer surface thereof and adapted to engage with stop means mounted on an inner surface of the chassis when the unit is partly withdrawn from the chassis, thereby to prevent complete removal therefrom;

a combined grip and release mechanism in the form of a first handle mounted on a top surface of said unit, exposed by said partial withdrawal, which is operable to disengage the catch means from the stop means to allow complete withdrawal of the unit from the chassis, said first handle being designed for gripping and carrying to support the full weight of the unit, wherein when the unit is at said partly withdrawn position, the first handle is movable from a first position lying flush with the surface of the unit, where the catch is engaged with the stop, to a second position standing proud from the unit surface, where the catch is disengaged from the stop; and a second handle at the front of the unit for use in withdrawing the unit from the chassis to said partly withdrawn position.

11. A removable electrical unit as claimed in claim 10, wherein the catch means comprises a stop block protruding from the outer surface of the unit designed to engage a spring which is fixed at one end to the inner surface of the chassis.

12. A removable electrical unit as claimed in claim 11 wherein the first handle is connected to the stop block by means of a movable link plate, wherein when the unit is in said partly removed position, movement of the first handle from first to second position causes the link plate to bear against the block to cause the block to disengage from the stop means.

13. A removable electrical unit as claimed in claim 12 further comprising a retaining spring fixed to the unit and arranged to engage the lower surface of the stop block wherein when said first handle is moved from first to second position, the stop block bears against the retaining spring.

* * * * *